United States Patent [19]

Phillips

[11] 4,442,388
[45] Apr. 10, 1984

[54] X-Y ADDRESSABLE WORKPIECE POSITIONER HAVING AN IMPROVED X-Y ADDRESS INDICIA SENSOR

[75] Inventor: Edward H. Phillips, Mountain View, Calif.

[73] Assignee: Optimetrix Corporation, Mountain View, Calif.

[21] Appl. No.: 286,985

[22] Filed: Jul. 27, 1981

Related U.S. Application Data

[63] Continuation of Ser. No. 136,816, Apr. 2, 1980, abandoned, which is a continuation of Ser. No. 925,454, Jul. 17, 1978, abandoned.

[51] Int. Cl.³ .......................... G05B 1/06; G01J 1/20
[52] U.S. Cl. .................................... 318/640; 29/407; 250/201
[58] Field of Search ............... 29/407, 593, 702, 720, 29/721, 740, 759; 269/63; 356/401; 250/201; 318/640; 414/331, 416

[56] References Cited

U.S. PATENT DOCUMENTS

| | | | |
|---|---|---|---|
| 3,581,375 | 6/1971 | Rottmann | 29/407 |
| 3,634,689 | 1/1972 | Ejiri et al. | 250/201 |
| 3,712,740 | 1/1973 | Hennings | 356/401 X |
| 3,821,545 | 6/1974 | Nakagawa et al. | 250/201 |
| 3,902,615 | 9/1975 | Levy et al. | 250/201 X |
| 3,943,359 | 3/1976 | Matsumoto et al. | 356/401 X |
| 4,057,347 | 11/1977 | Moriyama et al. | 356/401 X |

*Primary Examiner*—E. Michael Combs
*Attorney, Agent, or Firm*—Roland I. Griffin; Harry E. Aine

[57] ABSTRACT

In an X-Y addressable workpiece positioner, the workpiece to be positioned, such as a semiconductive wafer to be sequentially exposed at different regions thereof in accordance with a pattern of a mask, is disposed for movement with a work stage along coordinate X and Y axes. The work stage has a two-dimensional array of X and Y coordinate addressing indicia enclosed within a border and affixed to the work stage for movement therewith. A portion of an enlarged image of the array of addressing indicia is projected onto a sensor stage to derive an output indicative of the X and Y coordinates of the array of addressing indicia relative to the position of the sensor stage. The X and Y coordinates of the array of addressing indicia are sensed through addressing indicia recognition windows of the sensor stage and are differentially compared to remove unwanted background effects. Concomitantly, the border is sensed through border sensing windows of the sensor stage to provide a frame of reference for the sensed X and Y coordinates of the array of addressing indicia. The sensed X and Y coordinates of the array of addressing indicia are compared with the X and Y coordinates of a selected addressed position of the work stage to derive an error output. In response to this error output the work stage is moved to the selected addressed position so as to position a region of the workpiece for exposure in accordance with the pattern of the mask. The work stage is sequentially moved to succeeding addressed positions in the same manner to position each of the remaining regions of the workpiece for exposure in accordance with the pattern of the mask.

48 Claims, 8 Drawing Figures

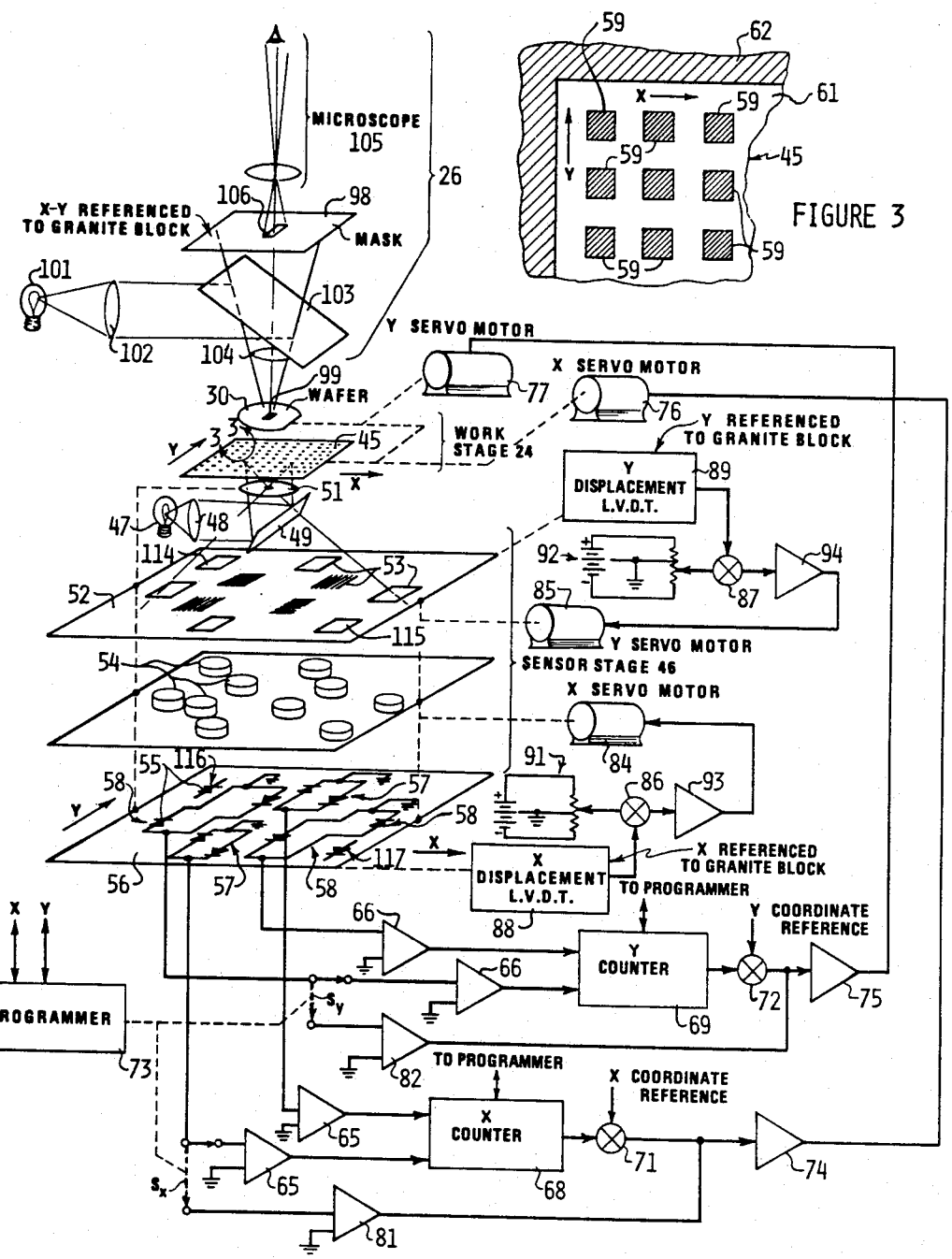
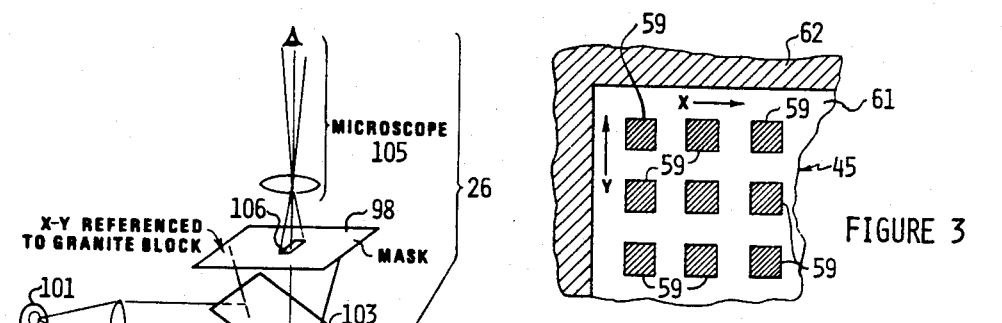
FIGURE 2
FIGURE 3

X-Y ADDRESSABLE WORKPIECE POSITIONER HAVING AN IMPROVED X-Y ADDRESS INDICIA SENSOR

This is a continuation of application Ser. No. 136,816, filed Apr. 2, 1980, abandoned which is in turn a continuation of Application Ser. No. 925,454, filed July 17, 1978 abandoned.

BACKGROUND OF THE INVENTION

The present invention relates in general to X-Y addressable workpiece positions and, more particularly, to an improved positioner particularly useful in an alignment and exposure machine of the type employed for sequentially aligning images of different regions of a semiconductive wafer with a mask and for exposing each such region of the semiconductive wafer in accordance with a pattern of the mask.

DESCRIPTION OF THE PRIOR ART

Heretofore, X-Y addressable workpiece positioners have been proposed in which a mask is sequentially stepped to different X and Y coordinates for sequentially exposing different portions of the mask in accordance with a pattern of a reticle. One such prior art stepper is manufactured by Jade Manufacturing Co. In that stepper the mask is disposed on a work stage that is addressably movable to different X and Y coordinates along coordinate X and Y axes and that is sequentially addressed to position different regions of the mask for exposure in accordance with the pattern of the reticle. Two separate one-dimensional arrays of respective X and Y parallel scribe lines are affixed to the work stage for use in moving it to the X and Y coordinates of an addressed position selected by an operator. Sensors are set up to sense the X and Y coordinates of an addressed position of the work stage by respectively sequentially sensing the X and Y scribe lines of these arrays. X and Y servo motors responsive to the sensed X and Y coordinates move the work stage to the addressed position selected by the operator. However, the work stage does not move simultaneously along both the X and Y axes to the addressed position. Rather, the Y coordinate of the addressed position is first sensed and the work stage moved along the Y axis to that Y coordinate. Then the X coordinate of the addressed position is sensed and the work stage moved along the X axis to that X coordinate.

This stepper has the disadvantage that the work stage cannot move along the shortest path from a first addressed position to a second addressed position, but, on the contrary, must move from the first addressed position to a reference position from which the X or the Y scribe lines may be sequentially sensed for moving the work stage to any new X or Y coordinate, respectively, of the second addressed position. If the second addressed position has both new X and Y coordinates, the work stage is initially moved to a reference position from which the Y scribe lines are sequentially sensed and the work stage moved to another reference position having the new Y coordinate. From the latter reference position the X scribe lines are sequentially sensed and the work stage moved to the second addressed position having both the new X and Y coordinates. In addition, this stepper depends for its accuracy upon the orthogonality of Y axis bearing support of the work stage with respect to the X axis of motion of the work stage. While this orthogonality can be accurately controlled, it requires expensive components to do so.

It is also known, from the prior art in such addressable workpiece positioners, to employ a mirror affixed to the work stage for movement therewith and thus for movement with the workpiece. A laser beam is directed along an optical path onto the mirror in such a manner as to produce X and Y interference fringes of the laser beam, such fringes being counted for precisely positioning the work stage and, hence, the workpiece at the X and Y coordinates of an addressed position.

The problem with this scheme is that the standard for determining both the X and Y coordinates of an addressed position of the workpiece is the wavelength of the laser beam. The wavelength of the laser beam, however, is a function of the temperature, pressure and humidity of the optical path used to produce the interference fringes. As a consequence, the work stage must be contained within an environmental chamber for controlling the temperature, pressure and humidity to a very high degree. Such a chamber is relatively expensive and complicates the addressable workpiece positioner and the use thereof.

Therefore, a less expensive and less complicated X-Y addressable workpiece positioner is desired which is capable of moving a work stage for a workpiece to a sequence of repeatably addressed positions with an accuracy of better than one tenth of a micron. It is also desired that the work stage move in a more direct path from a first addressed position to a subsequent addressed position so as to reduce the time required for moving between the sequentially addressed positions.

SUMMARY OF THE PRESENT INVENTION

The principal object of the present invention is the provision of an improved X-Y addressable workpiece positioner and an improved alignment and exposure machine using same.

In accordance one feature of the present invention, an image of a two-dimensional array of X and Y coordinate addressing indicia affixed to and movable with a work stage along coordinate X and Y axes is projected onto a sensor stage. The sensor stage includes two pairs of pattern recognition windows for independently recognizing and sensing enlarged images of the X and Y coordinate addressing indicia. Sensed images from the windows of each pair of pattern recognition windows are differentially compared to cancel ambient background effects, whereby a more precise positioning is derived from the X and Y coordinate addressing indicia.

In accordance with another feature of the present invention, one window of each pair of pattern recognition windows includes an array of parallel transparent elongated regions, the axis of elongation of those regions being orthogonal to the respective X or Y coordinate addressing indicia sensed thereby.

In accordance with still another feature of the present invention, the two-dimensional array of X and Y coordinate addressing indicia is enclosed within a border, and the sensor stage includes broder sensing windows for sensing portions of the border disposed along the coordinate X and Y axes and for referencing the sensed X and Y coordinate addressing indicia to those sensed portions of the border.

BRIEF DESCRIPTION OF THE DRAWINGS

FIG. 2 is a schematic perspective view, partly in block diagram form, of a portion (including an X-Y addressable workpiece positioner employing features of the present invention) of the machine of FIG. 1.

FIG. 3 is an enlarged detailed view of a portion of an array of X and Y coordinate addressing indicia employed as part of a work stage of the positioner of FIG. 2 as delineated by line 3—3.

DESCRIPTION OF THE PREFERRED EMBODIMENTS

Figure 1:
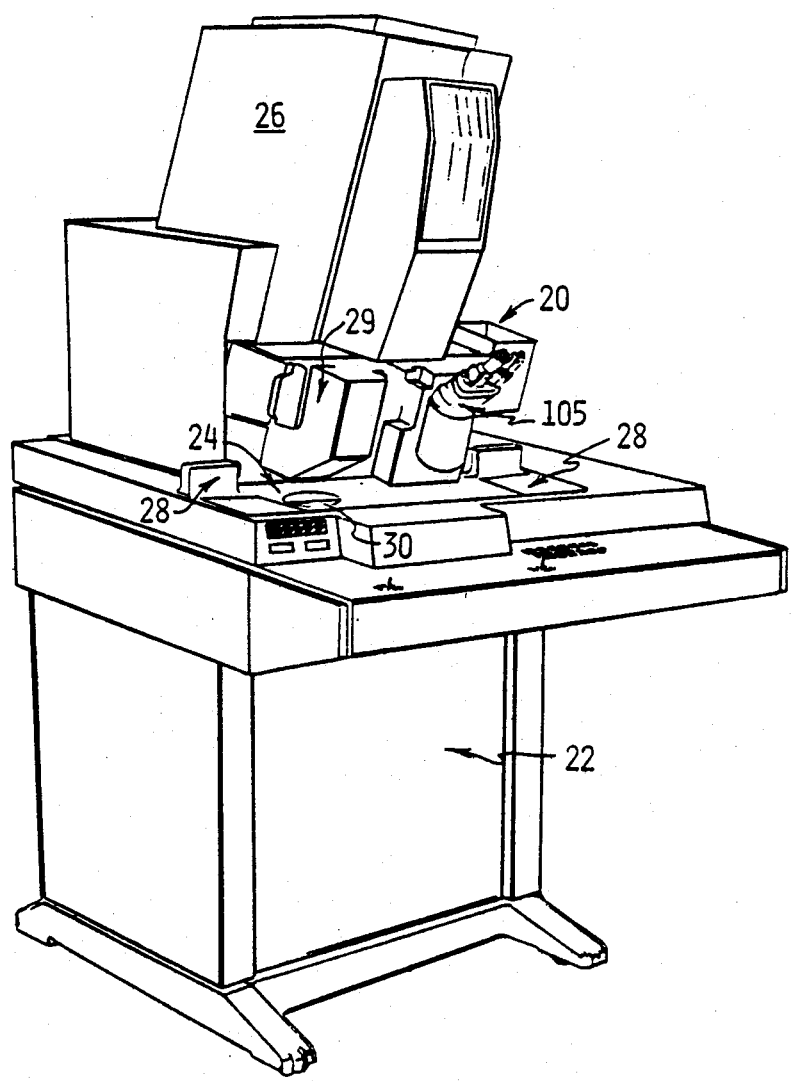
FIG. 1 is a perspective view of a step-and-repeat alignment and exposure machine employing features of the present invention.

Referring now to FIG. 1, there is shown a step-and-repeat projection alignment and exposure machine 20 incorporating features of the present invention. This machine 20 includes a base unit 22, a precision work stage 24 supported on the base unit for holding a workpiece, such as a semiconductive wafer 30, and for precisely positioning the workpiece along coordinate X and Y axes in a horizontal plane. An optical unit 26 is supported from the base unit 22 for use in aligning and exposing the wafer 30. An automatic workpiece handling unit 28 is also supported on the base unit 22 for transporting wafers 30 to and from the work stage 24. The base unit 22 includes a stationary granite block having an upper reference surface which is flat to within one micron across the surface thereof and having a cylindrical bore extending vertically therethrough for a sensor stage 46 (see FIG. 21).

Referring now to both FIGS. 1 and 2, in operating the alignment and exposure machine 20, the operator introduces a wafer 30 into the automatic workpiece handling unit 28 which then precisely positions the wafer on the work stage 24. The operator moves a microscope 105 of the optical unit 26 into position for use with a projection lens 104 in viewing a pattern bearing surface of a photographic mask 98 and an image of an addressed region of the upper surface of the wafer 30 to be precisely optically aligned. Following this alignment, the addressed region of the upper surface of the wafer 30 is exposed in accordance with the pattern of the mask 98.

The operator selects the addressed region of the wafer 30 to be exposed in accordance with the pattern of the mask 98. X and Y servo motors 76 and 77 are coupled to the work stage 24 for moving the work stage and a two-dimensional array 45 of X and Y coordinate addressing or positioning indicia affixed thereto over the sensor stage 46. to position the addressed region of the wafer 30 for exposure. The operator then views the addressed region of the wafer 30 illuminated by light projected through the optical unit 26 onto the addressed region of the wafer. An image of the illuminated addressed region of the wafer 30 is projected onto the back side of the mask 98 and thereby superimposed on the pattern of the mask for viewing by the operator through the microscope 105 while controls are manipulated to adjust the position of the sensor stage 46. This manipulation causes a slight correction to be made in the position of the work stage 24 (then locked to move with the sensor stage 46) for precisely aligning the viewed image of the illuminated addressed region of the wafer 30 with the pattern of the mask 98. The operator then moves the microscope 105 out of the way and moves a projection light source 29 into position for exposing the addressed region of the wafer 30 in accordance with the pattern of the mask 98 through the projection lens 104. Following this exposure, the programmer 73 causes the work stage 24 to advance to the next addressed position at which another region of the wafer 30 is exposed. The wafer is sequentially exposed by this step-and-repeat process until the wafer is totally exposed, at which point the operator or programmer initiates operation of the automatic workpiece handling unit 28 to remove the exposed wafer from the work stage 24 and advance a new wafer into position on the work stage.

Referring now specifically to FIG. 2, there is shown an X-Y addressable workpiece positioner forming part of the alignment and exposure machine 20 of FIG. 1 and incorporating features of the present invention. In this workpiece positioner, the wafer 30 is positioned on and held by the work stage 24 above the array 45 of X and Y coordinate addressing indicia affixed to and moveable with the work stage. The sensor stage 46 is disposed below the work stage 24 and the array 45 of addressing indicia. A lamp 47 provides illumination that is projected by a lens 48 into a beam directed onto a beam splitting mirror 49, which in turn directs the illumination through a magnifying lens 51 onto a relatively small region of the array 45 of X and Y coordinate addressing indicia for illuminating same.

An image of the illuminated region of the array 45 of X and Y coordinate addressing indicia is projected via the magnifying lens 51 through the beam splitting mirror 49 and focused onto an opaque sensing window plate 52 forming part of the sensor stage 46 and having a plurality of different windows 53 formed therein and disposed along the coordinate X and Y axes for sensing the X and Y coordinate addressing indicia. In a typical example, the magnification M of the magnifying lens 51 is 13X such that the aforementioned image, as projected onto the sensing window plate 52, is thirteen times actual size. The windows 53 permit the light incident thereon to pass therethrough to respective stick lenses 54 arranged in registration with the respective windows. Thus, the stick lenses 54 receive the light passing through the respective windows 53 and focus that light onto respective PIN diodes 55 disposed on a sensing diode plate 56 of the sensor stage 46.

Two pairs 57 of the diodes 55 are arranged and connected for recognizing and sensing the X coordinates of the array 45 of addressing indicia, whereas two additional pairs 58 of the diodes 55 are arranged and connected for sensing the Y coordinates of the array 45 of addressing indicia. The diodes of each pair 57 and 58 are connected in bucking relation so as to provide a zero output when the illumination of each respective diode of the pair is equal.

Referring now to FIG. 3, there is shown a portion of the array 45 of X and Y coordinate addressing indicia. The indicia 59 comprise, for example, square dots of chromium plating on a fused silica plate 61. A border 62 of chromium plating surrounds the array 45 of addressing indicia 59, which are arranged in rows and columns along the X and Y axes, respectively. The X coordinates of the array 45 of addressing indicia 59 comprise the columns, and the Y coordinates comprise the rows. Thus, each addressable position of the work stage 24 of FIG. 2 is defined by a given indicium 59 having a column number corresponding to the number of the X coordinate columns from the left-hand side of the border 62 (which is aligned with the Y axis) to that indicium and a row number corresponding to the number of Y coordinate rows from the front side of the border (which is aligned with the X axis) to that indicium. In a typical example, the indicia 59 are 10 microns square located on 20 micron centers along both the X and Y axes.

Referring now to both FIGS. 2 and 3, the sensing window plate 52 includes column and row recognition windows 53 which are of generally two kinds. A first kind of these windows is a transparent rectangle having a width of 1300 microns and a length of 1560 microns for viewing a magnified image of a rectangular area of 100 microns by 120 microns of the array 45 of addressing indicia 59 (this area corresponds to the space occupied by a 5×6 sub-array of addressing indicia 59). Each window of this first kind is paired with a window of the second kind comprising an array of eight parallel, elongated transparent slots having a center-to-center spacing of 260 microns corresponding to a magnified image of the 20 micron center-to-center spacing of the addressing indicia 59. Six of these slots have a width of 130 microns and a length of 2080 microns for viewing a magnified image of a rectangular area of 10 microns by 160 microns of the array 45 of addressing indicia 59, and the remaining two slots have a width of 130 microns and a length of 1560 microns for viewing a magnified image of a rectangular area of 10 microns by 120 microns of the array of addressing indicia. This permits an image of eight or six addressing indicia 59 to be observed through each of these respective types of slots of each window of the second kind. Thus, each window of the second kind permits a magnified image of sixty addressing indicia 59 to be observed, whereas each window of the first kind permits a magnified image of thirty addressing indicia to be observed (i.e., permits illumination from thirty indicia to pass therethrough). However, both types of windows are of equal transparent area. Thus, the output from each of the pairs 57 or 58 of diodes 55 connected in bucking relation will be zero or a null when the sensed magnified images of the addressing indicia 59 disposed in a column or row aligned parallel to the slots of one of the windows of the second kind are half covered by the opaque spacing between those slots (i.e., when a marginal edge of each of those slots falls along the center points of the sensed magnified images of the addressing indicia of each such column or row). It should be noted that the slots of the windows of the second kind are elongated in a direction normal to the direction being sensed (i.e., the slots of a column recognition window of the second kind are oriented along the Y axis and the slots of a row recognition window of the second kind are oriented along the X axis).

Figure 4:
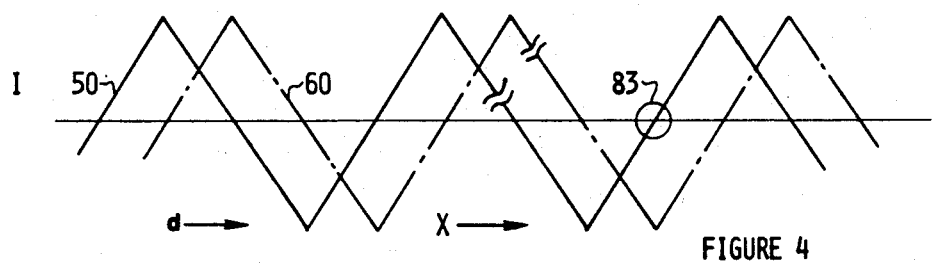
FIG. 4 is a pilot of triangular output current waveforms derived from an X coordinate addressing indicia sensing portion of a sensing diode plate employed in the positioner of FIG. 2 as a function of movement of the work stage in the X direction.

Each X or Y coordinate sensing diode pair 57 or 58 produces a triangular output current waveform 50 or 60 of the type shown in FIG. 4 as the work stage 24 is moved. Each cycle of each triangular output current waveform 50 or 60 corresponds to the counting of a given X coordinate column or Y coordinate row of the array 45 of addressing indicia 59 depending upon whether the waveform is produced by an X or a Y coordinate sensing diode pair 57 or 58, respectively.

The two window pairs of the sensing window plate 52 which correspond to the two X coordinate sensing diode pairs 57 of the sensing diode plate 56 are offset relative to one another along the X axis by an amount equal to one fourth of the magnified image of the 20 micron center-to-center spacing of the addressing indicia 59 as projected onto the sensing window plate (i.e., 65 microns). This offset results in a 90° spacial offset in the triangular output current waveforms 50 and 60 produced by the two X coordinate sensing diode pairs 57 when the X coordinate of the array 45 of addressing indicia 59 is being sensed. As shown in FIG. 4, when the work stage 24 is being advanced in the positive X direction along the X axis the triangular output current waveform 50 produced by a first X coordinate sensing diode pair 57 will lead the other triangular output current waveform 60 produced by the second X coordinate sensing diode pair 57, whereas when the work stage is being advanced in the negative X direction along the X axis, the triangular output current waveform 60 will lead the triangular output current waveform 50.

Similarly, the two window pairs of the sensing window plate 52 which correspond to the two Y coordinate sensing diode pairs 58 of the sensing diode plate 56 are offset along the Y axis by an amount equal to one fourth of the magnified image of the 20 micron center-to-center spacing of the addressing indicia 59 as projected onto the sensing window plate (i.e., 65 microns). This provides a 90° spacial offset similar to that shown in FIG. 4 in the triangular output current waveforms 50 and 60 produced by the two Y coordinate sensing diode pairs 58 when the work stage 24 is being advanced along the Y axis to sense the Y coordinate of the array 45 of addressing indicia. The triangular output current waveform 50 produced by a first Y coordinate sensing diode pair 58 will either lead or lag the triangular output current waveform 60 produced by the second Y coordinate sensing diode pair 58 depending on whether the work stage 24 is being advanced in the positive or the negative direction, respectively, along the Y axis.

Referring now specifically to FIG. 2, the triangular output current waveforms 50 and 60 from the two X coordinate sensing diode pairs 57 are applied to respective amplifiers and wave shapers 65 coupled to an X counter 68. Similarly, the triangular output current waveforms 50 and 60 from the two Y coordinate sensing diode pairs 58 are applied to respective amplifiers and wave shapers 66 coupled to a Y counter 69. The amplifiers and wave shapers 65 produce square wave signals 50' and 60' of the type shown in FIG. 5 from the respective triangular output current waveforms 50 and 60 applied thereto, and the amplifiers and wave shapers 66 also produce such square wave signals 50' and 60' from the respective triangular output current waveforms 50 and 60 applied thereto. Thus, there is one square wave pulse per X coordinate column or Y coordinate row of addressing indicia sensed by the sensing window plate 52 and sensing diode plate 56.

Figure 5:
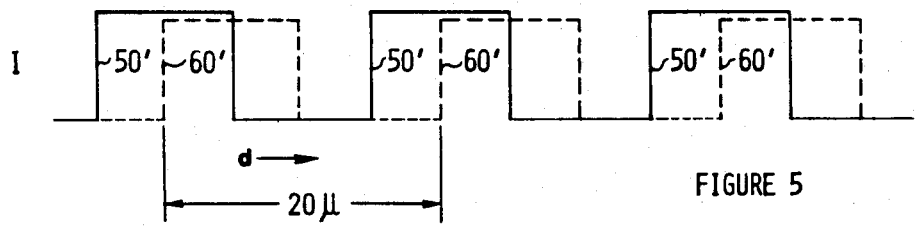
FIG. 5 is a plot of square wave output waveforms derived from the triangular output current waveforms of FIG. 4.

When the square wave signals 50' and 60' from the amplifiers and wave shapers 65 or 66 are derived from a leading triangular output current waveform 50 (produced by the first X or Y coordinate sensing diode pair 57 or 58) and a lagging triangular output current waveform 60 (produced by the second X or Y coordinate sensing diode pair 57 or 58), as when the work stage 24 is being advanced in the positive X or Y direction along the X or Y axis (i.e., when the square wave signal 50' leads the square wave signal 60' as shown in FIG. 5), the respective X or Y counter 68 or 69 is latched for counting X coordinate columns or Y coordinate rows of addressing indicia in a positive direction producing a positive count. Similarly, when the square wave signals 50' and 60' are derived from a lagging triangular output current waveform 50 and a leading triangular output current waveform 60, as when the work stage 24 is being advanced in the negative direction along the X or Y axis (i.e., when the square wave signal 50' lags the square wave signal 60'), the respective X or Y counter 68 or 69 is latched for counting X coordinate columns or Y coordinate rows of addressing indicia in a negative direction producing a negative count. The outputs of the X and Y counters 68 and 69 are applied to respective error detectors 71 and 72 for comparison with X and Y coordinate reference address inputs derived from the programmer 73, which is programmed by the operator to select predetermined address positions of the work stage 24 (and, hence, of the wafer 30 held thereby). Error outputs derived from the respective error detectors 71 and 72 are applied to the inputs of respective servo amplifiers 74 and 75, the outputs of which are applied to the respective X and Y servo motors 76 and 77 for driving the work stage 24 in such a direction as to cause the error outputs from the error detectors to go toward zero.

Figure 6:
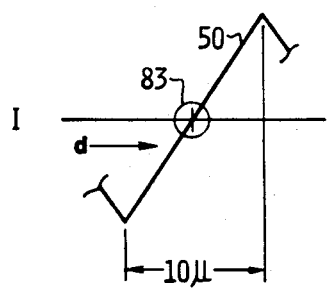
FIG. 6 is a plot of a portion of one triangular output current waveform of FIG. 4 employed in locking the work stage to the X coordinate of an addressed postion.

The programmer 73 keeps track of the counted number of X coordinate columns and Y coordinates rows of addressing indicia and of the remaining number of X coordinate columns and Y coordinate rows to reach the X and Y coordinates of the desired reference address (i.e., the addressed position of the work stage 24) and controls the rate at which the X and Y servo motors 76 and 77 move the work stage so that certain predetermined acceleration and deceleration limits are not exceeded. For example, the programmer 73 controls the acceleration and deceleration to one tenth of a G (the force of gravity). When the error output from the error detector 71 is within one X coordinate column of the X coordinate of the addressed position of the work stage 24, the programmer 73 sets a switch $S_x$ for applying the output of the first X coordinate sensing diode pair 57 to an analog servo amplifier 81. Similarly, when the error output from the error detector 72 is within one Y coordinate row of the Y coordinate of the addressed position, the programmer 73 sets another switch $S_y$ for applying the output of the first Y coordinate sensing diode pair 58 to another analog servo amplifier 82. The outputs of the analog servo amplifiers 81 and 82 are applied to the inputs of the respective servo amplifiers 74 and 75 for causing the respective X and Y servo motors 76 and 77 to lock the work stage 24 in place (relative to the sensor stage 46) at respective X and Y coordinates corresponding to the respective crossover 83 of the respective portions of the respective triangular output waveforms 50 applied to the respective analog servo amplifiers 81 and 82 as shown in FIG. 6. Each such crossover 83 corresponds to the center of a 10 micron wide region of the workpiece in the X or the Y direction and is precisely determined and repeatable with an error of less than one tenth of a micron. Thus, the work stage 24 (and, hence, a wafer 30 held thereby) can be programmed to move to any selected one of a number of addressable positions spaced at 20 micron intervals along both the X and Y axes. In addition, these addressable positions can be repeatably addressed to within one tenth of a micron.

In addition, each addressed position of the work stage 24 can be interpolated (i.e., changed relative to a fixed position on the granite block) plus or minus 20 microns along both the X and Y axes by producing a relatively slight displacement of the sensor stage 46 (which otherwise remains stationary) and, hence, of the work stage (once the work stage is locked in place relative to the sensor stage so as to move therewith) relative to the granite block. More particularly, the sensor stage 46 (including the sensing window plate 52) is displaceable along both the X and Y axes by means of X and Y servo motors 84 and 85. These servo motors are controlled by error signals from respective X and Y error detectors 86 and 87. The output of an X displacement linear variable differential transformer 88 and the output of a Y displacement linear variable differential transformer 89 (both of which transformers are fixedly referenced to the granite block for detection of X and Y displacements of the sensor stage 46) are applied to the respective X and Y error detectors 86 and 87 for comparison with respective reference signals derived from respective X and Y reference potentiometers 91 and 92 under the control of the operator. The error signals from error detectors 86 and 87 are amplified by respective servo amplifiers 93 and 94 and applied to the respective X and Y servo motors 84 and 85. Thus, the X and Y reference potentiometers 91 and 92 permit interpolation of the X and Y coordinates of the addressed position of the work stage 24 to better than one tenth of a micron along both the X and Y axes.

In a totally automated system the interpolation settings of the X and Y reference potentiometers 91 and 92 and, hence, the reference signals derived from those potentiometers for comparison with the outputs of the X and Y displacement linear variable differential transformers 88 and 89 in interpolating the X and Y coordinates of the addressed position, could be selected by the programmer 73. However, in a preferred embodiment of a step-and-repeat alignment and exposure machine 20, such as that shown in FIGS. 1 and 2, for aligning the pattern bearing surface of the mask 98 and an image of a selected addressed region 99 of the upper surface of the wafer 30, it is particularly advantageous for the operator to have control over the interpolation settings of the X and Y reference potentiometers 91 and 92 as will become apparent below.

The addressed region 99 of the upper surface of the wafer 30 is illuminated by light directed from a lamp 101 to an illumination projection lens 102 and thence to a beam splitting mirror 103 from which it is reflected through the projection lens 104 onto the addressed region of the upper surface of the wafer. An image of the illuminated addressed region 99 of the upper surface of the wafer 30 is projected back through the projection lens 104 onto the back side of the mask 98 for viewing with the pattern of the mask through the microscope 105. Thus, the operator is able to observe through the microscope 105 a portion 106 of the pattern of the mask 98 (i.e., that portion falling within the field of the microscope) and a corresponding portion of the image of the illuminated region 99 of the upper surface of the wafer 30.

In cases where the wafer 30 has been through one or more steps in its processing, an image of a circuit pattern formed on the illuminated addressed region 99 of the upper surface of the wafer is observable with the pattern of the mask 98 through the microscope 105. The pattern of the mask 98 and the image of the circuit pattern of the wafer can be brought into precise alignment by observing them through the microscope 105 while adjusting the interpolating settings of the X and Y reference potentiometers 91 and 92 to align them to within better than one tenth of a micron. This precision is obtainable because the mask 98 is stationary relative to the granite block while the wafer 30 and, hence, the image of the illuminated addressed region 99 of the wafer are moved relative to the mask and the granite block with the work stage 24, which is locked by the X and Y servo motors 76 and 77, as described above, for movement with the sensor stage 46.

The interpolated addressed region 99 of the wafer 30 is then exposed in accordance with the pattern of the mask 98 by employing the projection light source 29 of FIG. 1 to illuminate the pattern of the mask and by projecting an image of the illuminated pattern of the mask through the projection lens 104 onto the region 99 of the wafer. Following this exposure operation, the interpolated (or zeroed) addressed position of the work stage 24 is used as a reference position from which the programmer 73 automatically causes the work stage to be sequentially moved to other predetermined addressed positions so as to sequentially position other regions of the wafer 30 for exposure in accordance with the pattern of the mask 98 (those regions being spaced from each other by predetermined distances related to the size of the image of the pattern of the mask as projected onto the wafer). The step-and-repeat alignment and exposure machine 20 of FIGS. 1 and 2 thus permits adjustments to be made in the addressed position of the work stage 24 in order to compensate for slight errors in the positioning of the wafer 30 on the work stage by the automatic workpiece handling unit 28 during the wafer loading operation.

Figure 7:
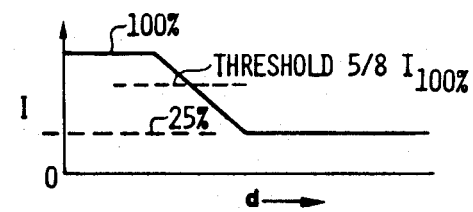
FIG. 7 is a plot of signal intensity of another output waveform derived from a border sensing portion of the sensing diode plate of FIG. 2 as a function of distance away from a border enclosing the array of X and Y coordinate addressing indicia.
Figure 8:
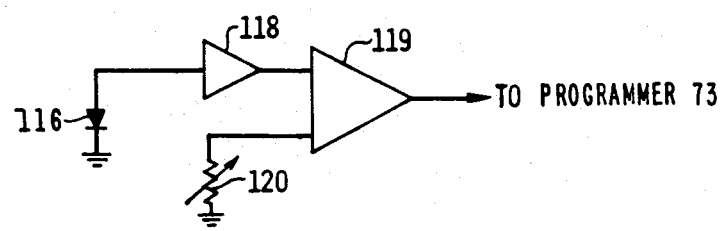
FIG. 8 is a schematic circuit diagram of a border sensing circuit employed for sensing the border enclosing the array of X and Y coordinate addressing indicia.

As previously described with reference to FIGS. 2 and 3, an image of an illuminated region of the array 45 of addressing indicia 59 is projected onto the sensing window plate 52 of the sensor stage 46. This is done in such a manner that the front side of the border 62 (which is aligned with the X axis and employed as a reference for the Y coordinate rows of addressing indicia 59 and which is disposed closest to the reader in the orientation of FIG. 2) is projected onto the sensing window plate 52 along the far side thereof from the reader. Similarly, the left-hand side of the border 62 (which is aligned with the Y axis and employed as a reference for the X coordinate columns of addressing indicia 59) is projected onto the sensing window plate 52 along the right-hand side thereof. Border sensing windows 114 and 115 of the sensing window plate 52 and corresponding diodes 116 and 117 of the sensing diode plate 56 are arranged for sensing the respective Y and X reference sides of the border 62. The signals produced by the respective diodes 116 and 117 (as shown in FIG. 7 for one of the diodes) are each applied (as shown in FIG. 8 for the diode 116) to a respective amplifier 118 for amplification and thence to one input of a respective threshold detector 119 for comparison with a reference signal derived from a respective reference potentiometer 120 and applied to another input of the threshold detector. The output of each threshold detector 119 is applied to the programmer 73 (such as a Texas Instrument 16 bit Model #9900 microprocessor) to indicate the crossing of the respective Y or X reference sides of the border 62.

More particularly, the signal level I produced by each diode 116 or 117 is shown in FIG. 7 as a function of the position of the respective border sensing window 114 or 115 relative to the image of the illuminated region of the array 45 of addressing indicia 59 projected thereon. When the border sensing window 114 or 115 is disposed entirely within a portion of that image containing only the addressing indicia 59, which provide a reflectivity coefficient of approximately 25 percent, the signal level I produced by the corresponding diode 116 or 117 is at 25 percent of full scale. However, as a portion of that image containing a portion of the border 62, which has a reflectivity coefficient of 100 percent, moves across the border sensing window 114 or 115, the signal level I produced by the corresponding diode 116 or 117 begins to increase as the image of that portion of the border begins to cover the border sensing window. When the image of that portion of the border 62 completely covers the border sensing window 114 or 115, the signal level I produced by the corresponding diode 116 or 117 is at 100 percent of full scale. Each threshold detector 119 is set so that a signal level corresponding to five eighths of full scale ($\frac{5}{8} I_{100\%}$ as shown in FIG. 7) triggers the threshold detector to provide an output indicating the sensing of the border 62.

When the step-and-repeat alignment and exposure machine 20 of FIGS. 1–3 is turned on, the programmer 73 causes the work stage 24 to be moved so that the sensor stage 46 senses the X and Y reference sides of the border 62 enclosing the array 45 of X coordinate columns and Y coordinate rows of addressing indicia 59 and so that the X and Y counters 68 and 69 are set to reference the X coordinate column and Y coordinate row counts to the respective X and Y reference sides of the border. More particularly, the X reference side of the border 62 is sensed by the programmer 73 causing the work stage 24 to be moved in the negative direction along the X axis, while maintaining an initial 4 coordinate address, until such time as an image of the X reference side of the border is detected by border sensing window 115, the corresponding diode 117, and the corresponding threshold detector 119 (see FIG. 8) as described above. The output of the corresponding threshold detector 119 is applied to the programmer 73 for referencing the X coordinate column count of the X counter 68 to the respective X reference side of the border 62. The programmer 73 then causes the work stage 24 to be moved in the positive direction along the X axis, while maintaining the initial Y coordinate address, until such time as the X counter 68 has counted to the center X coordinate column of the array 45 of addressing indicia 59. The programmer then causes the work stage 24 to be moved in the negative direction along the Y axis, while maintaining the center X coordinate address, until such time as an image of the Y reference side of the border 62 is detected by the border sensing window 114, the corresponding diode 116, and the corresponding threshold detector 119. The output of the corresponding threshold detector 119 is applied to the programmer 73 for referencing the Y coordinate row count of the Y counter 69 to the respective Y reference side of the border 62.

It should be noted that the first sensing diode pair 57, which is employed with the switch $S_x$ and the analog servo amplifier 81 in locking the work stage 24 in place (relative to the sensor stage 46) at the X coordinate of the addressed position, as previously described with reference to FIGS. 2-4 and 6, comprises the sensing diode pair 57 furthest from the diode 116 employed for sensing the Y reference side of the border 62. This permits the sensor stage 46 to be efficiently employed both in sensing the Y reference side of the border 62 and in stopping the movement of the work stage 24 and locking it in place at the X coordinate of the addressed position. For similar reasons, the sensing diode pair 58, which is employed with the switch $S_y$ and the analog servo amplifier 82 in locking the work stage 24 in place at the Y coordinate of the addressed position, similarly comprises the sensing diode pair 58 furthest from the diode 117 employed for sensing the X reference side of the border 62.

The above-described X-Y addressable workpiece positioner and step-and-repeat alignment and exposure machine 20 using same have the advantage of permitting the work stage 24 and, hence, a workpiece held thereby to be stepped sequentially to addressable positions precisely determinable to better than one tenth of a micron. The stepping of the work stage 24 and, hence, the workpiece held thereby from one addressable position to the next is accomplished by movement of the work stage and the workpiece along a path which is the shortest distance between those two addressed positions and which is precisely defined by a common two-dimensional array 45 of X and Y coordinate addressing indicia. This shortens the stepping time and increases the throughput of the machine. Moreover, the accuracy of the addressed positions is precisely determined by the precise positioning of the X and Y coordinate addressing indicia rather than being dependent upon the precision of the orthogonality of costly bearing assemblies or upon laser interferometers requiring environmentally controlled chambers.

As used herein, a "two-dimensional array" of addressing indicia shall be defined to include indicia arrayed (i.e., serialized) in two directions. Thus, a series of parallel lines in a one-dimensional array, whereas a series of dots serialized in two directions, as in FIG. 3, comprises a two-dimensional array.

I claim:

1. In an X-Y addressable workpiece positioning method, the steps of:
    coupling a workpiece to a work stage movable in X and Y directions within a common plane of movement defined by the X and Y directions and within which the workpiece is to be positioned, the work stage having a two-dimensional array of X and Y coordinate positioning indicia affixed thereto for effecting positioning of the work stage with the workpiece;
    projecting an enlarged image of at least a portion of the array of X and Y coordinate positioning indicia onto a relatively stationary sensor stage;
    sensing the enlarged image through at least two pairs of pattern recognition windows for independently recognizing and sensing the X and Y coordinate positioning indicia of the enlarged image to determine the X and Y coordinates of the position of the work stage, a sensed output being derived through each window of each pair of pattern recognition windows;
    subtracting the sensed output derived through one window of each pair of pattern recognition windows from the sensed output derived through the other window of the same pair to cancel ambient background effects;
    comparing the X and Y coordinates of the position of the work stage with the X and Y coordinates of a different position of the work stage to derive an error output; and
    moving the work stage with the workpiece and the array of X and Y coordinate positioning indicia to the different position in response to the error output.

2. The method of claim 1 wherein each window of each pair of pattern recognition windows has a transparent area equal to that of the other window of the same pair.

3. The method of claim 1 wherein one window of each pair of pattern recognition windows includes an array of parallel transparent elongated regions with the axis of elongation of those regions being orthogonal to the direction in which the respective X or Y coordinate positioning indicia are sensed thereby.

4. In an X-Y addressable workpiece positioning method, the steps of:
    coupling a workpiece to a work stage movable in X and Y directions within a common plane of movement defined by the X and Y directions and within which the workpiece is to be positioned, the work stage having a two-dimensional array of X and Y coordinate positioning indicia affixed thereto for effecting positioning of the work stage with the workpiece and provided with X and Y border indicia for referencing the X and Y coordinate positioning indicia, respectively;
    projecting an enlarged image of at least a portion of the array of X and Y coordinate positioning indicia onto a relatively stationary sensor stage for sensing the X and Y coordinate positioning indicia of the enlarged image to derive an output determinative of the X and Y coordinates of the position of the work stage;
    moving the work stage so that the sensor stage is operable for sequentially sensing the X and Y border indicia of the enlarged image, and referencing the sensed X and Y coordinate positioning indicia to the sensed X and Y border indicia, respectively;
    comparing the X and Y coordinates of the position of the work stage with the X and Y coordinates of a different position of the work stage to derive an error output; and
    moving the work stage with the workpiece and the array of X and Y coordinate positioning indicia to the different position in response to the error output.

5. The method of claim 4 wherein:
    the array of X and Y coordinate positioning indicia comprises an array of dots having an optical transmission or reflectance coefficient of a first value;
    the X and Y border indicia have an optical transmission or reflectance coefficient of a second value; and each of the X and Y border indicia is sensed by detecting an optical transmission or reflectance coefficient of a value intermediate the first and second values.

6. In an X-Y addressable workpiece positioning method, the steps of:
  coupling the workpiece to a work stage movable in X and Y directions within a common plane of movement defined by the X and Y directions and within which the workpiece is to be positioned, the work stage having a two-dimentional array of X and Y coordinate positioning indicia affixed thereto for effecting positioning of the work stage with the workpiece and provided with X and Y border indicia for referencing the X and Y coordinate positioning indicia, respectively;
  projecting an enlarged image of at least a portion of the array of X and Y coordinate positioning indicia onto a relatively stationary sensor stage;
  sensing the enlarged image through at least two pairs of pattern recognition windows for independently recognizing and sensing the X and Y coordinate positioning indicia of the enlarged image to determine the X and Y coordinates of the position of the work stage, a sensed output being derived through each window of each pair of pattern recognition windows;
  subtracting the sensed output derived through one window of each pair of pattern recognition windows from the sensed output derived through the other window of the same pair to cancel ambient background effects;
  moving the work stage with the workpiece so that the sensor stage is operable for sequentially sensing the X and Y border indicia of the enlarged image through respective X and Y border sensing windows, and referencing the sensed X and Y coordinate positioning indicia to the sensed X and Y border indicia, respectively, the X and Y border sensing windows being located in the sensor stage closer to the respective X and Y border indicia of the enlarged image than the center of each respective pair of pattern recognition windows so as to permit the pairs of pattern recognition windows to be employed for sensing the X and Y coordinate positioning indicia of the enlarged image while the X and Y border sensing windows are employed for sensing the respective X and Y border indicia of the enlarged image.

7. In an X-Y addressable workpiece positioning apparatus:
  work stage means movable in both X and Y directions within a common plane of movement defined by the X and Y directions and within which a workpiece is to be positioned;
  the work stage means including holding means for holding the workpiece for movement with the work stage means;
  indicia means comprising a two-dimensional array of X and Y coordinate positioning indicia affixed to the work stage means and movable therewith for effecting positioning of the work stage means;
  relatively stationary sensor stage means for determining the X and Y coordinates of the work stage means;
  projector means for projecting an enlarged image of at least a portion of the array of X and Y coordinate positioning indicia onto the sensor stage means;
  the sensor stage means including at least two pairs of pattern recognition windows and corresponding sensing means for independently recognizing and sensing the X and Y coordinate positioning indicia of the enlarged image to derive a sensed output through each window of each pair of pattern recognition windows and determine the X and Y coordinates of the position of the work stage means, the sensing means being coupled for subtracting the sensed output derived through one window of each pair of pattern recognition windows from the sensed output derived through the other window of the same pair to cancel ambient background effects;
  comparative means for comparing the X and Y coordinates of the position of the work stage means with the X and Y coordinates of a different position of the work stage means to derive an error output; and
  drive means for moving the work stage means and the array of X and Y coordinate positioning indicia to the different position in response to the error output.

8. The apparatus of claim 7 wherein each window of each pair of pattern recognition windows has a transparent area equal to that of the other window of the same pair.

9. The apparatus of claim 7 wherein one window of each pair of pattern recognition windows includes an array of parallel transparent elongated regions with the axis of elongation of those regions being orthogonal to the direction in which the respective X or Y coordinate positioning indicia are sensed thereby.

10. In an X-Y addressable workpiece positioning apparatus:
  work stage means movable in both X and Y directions within a common plane of movement defined by the X and Y directions and within which a workpiece is to be positioned;
  the work stage means including holding means for holding the workpiece for movement with the work stage means;
  indicia means comprising a two-dimensional array of X and Y coordinate positioning indicia affixed to the work stage means and movable therewith for effecting positioning of the work stage means, and X and Y border indicia for referencing the X and Y coordinate positioning indicia, respectively;
  relatively stationary sensor stage means for determining the X and Y coordinates of the work stage means;
  projector means for projecting an enlarged image of at least a portion of the array of X and Y coordinate positioning indicia onto the sensor stage means so that the X and Y coordinate positioning indicia of the enlarged image may be sensed by the sensor stage means;
  drive means for moving the work stage means so that the X and Y border indicia of the enlarged image may be sequentially sensed by the sensor stage means and the sensed X and Y coordinate positioning indicia referenced to the sensed X and Y border indicia, respectively, to determine the X and Y coordinates of the position of the work stage means; and
  comparative means for comparing the X and Y coordinates of the position of the work stage means with the X and Y coordinates of a different position to derive an error output, the drive means being operable for moving the work stage means and the array of X and Y coordinate positioning indicia to the different position in response to the error output.

11. The apparatus of claim 10 wherein:

the array of X and Y coordinate positioning indicia comprises a two-dimensional array of dots having an optical transmission or reflectance coefficient of a first value;

the X and Y border indicia have an optical transmission or reflectance coefficient of a second value; and the sensor stage means senses the X and Y border indicia of the enlarged image by detecting an optical transmission or reflectance coefficient of a value intermediate the first and second values.

12. In an X-Y addressable workpiece positioning apparatus:

work stage means movable in both X and Y directions within a common plane of movement defined by the X and Y directions and within which a workpiece is to be positioned;

the work stage means including holding means for holding the workpiece for movement with the work stage means;

indicia means comprising a two-dimensional array of X and Y coordinate positioning indicia affixed to the work stage means and movable therewith for effecting positioning of the work stage means, and X and Y border indicia for referencing the X and Y coordinate positioning indicia, respectively;

relatively stationary sensor stage means for determining the X and Y coordinates of the work stage means;

projector means for projecting an enlarged image of at least a portion of the array of X and Y coordinate positioning indicia onto the sensor stage means;

the sensor stage means including at least two pairs of pattern recognition windows and corresponding sensing means for independently recognizing and sensing the X and Y coordinate positioning indicia of the enlarged image to derive a sensed output through each window of each pair of pattern recognotion windows and determine the X and Y coordinates of the position of the work stage means, means for subtracting the sensed output derived through one window of each pair of pattern recognition windows from the sensed output derived through the other window of the same pair to cancel ambient background effects, and a pair of X and Y border recognition windows and corresponding sensing means for sensing the respective X and Y border indicia of the enlarged image, the X and Y border recognition windows being disposed closer to the respective X and Y border indicia of the enlarged image than the respective pairs of pattern recognition windows so as to permit sensing of the X and Y coordinate positioning indicia of the enlarged image while simultaneously sensing the X and Y border indicia of the enlarged image; and comparative means for comparing the X and Y coordinates of the position of the work stage means with the X and Y coordinates of a different position to derive an error output, the drive means being operable for moving the work stage means and the array of X and Y coordinate positioning indicia to the different position in response to the error output.

13. The method of claim 6 including the additional steps of:

comparing the X and Y coordinates of the position of the work stage with the X and Y coordinates of a different position of the work stage to derive an error output; and moving the work stage with the workpiece and the array of X and Y coordinate positioning indicia to the different position in response to the error output.

14. An addressable workpiece positioner comprising:

stage means for holding a workpiece, the stage means being movable along a pair of coordinate axes to addressable coordinate positions in a plane containing those axes and having a non-dimensional array of coordinate addressing indicia affixed thereto for movement therewith;

sensor means for determining the addressable coordinate position of the stage means;

optical means for projecting an image of a portion of the array of coordinate addressing indicia onto the sensor means;

the sensor means including at least two pairs of sensing means for sensing the coordinate addressing indicia of the image to determine the addressable coordinate position of the stage means;

compensating means, including each pair of sensing means, for compensating for undesired variations in the intensity of the image, control means for comparing the addressable coordinate position of the stage means with another addressable coordinate position to derive an error signal; and drive means for moving the stage means and the array of coordinate addressing indicia to said other addressable coordinate position in response to the error signal.

15. An addressable workpiece positioner as in claim 14 wherein each pair of sensing means comprises:

a transparent window of a first kind communicating with a corresponding first sensing element; and a transparent window of a second kind communicating with a corresponding second sensing element and having a transparent area equal to that of the window of the first kind.

16. An addressable workpiece positioner as in claim 15 wherein:

each window of the first kind comprises a group of parallel transparent elongated regions each having an axis of elongation parallel to the respective columns or rows of addressing indicia sensed thereby, having a width equal to that of each respective column or row of addressing indicia sensed thereby, and having a length equal to that of an integer multiple of the center-to-center spacing of the respective columns or rows of addressing indicia sensed thereby; and each window of the second kind comprises a single transparent region having one or more rectangular areas of a width and a length equal to an integer multiple of the center-to-center spacing of the respective columns or rows of addressing indicia sensed thereby.

17. An addressable workpiece positioner as in claim 16 wherein the optical means includes a magnifying lens for enlarging the image projected onto the sensor means.

18. An addressable workpiece positioner as in claim 17 wherein the first and second sensing elements of each pair of sensing means are connected in bucking relationship.

19. An addressable workpiece positioner as in claim 14 wherein the sensor means includes four pairs of sensing means.

20. An addressable workpiece positioner as in claim 19 wherein each pair of sensing means comprises:
a transparent window of a first kind communicating with a corresponding first sensing element; and
a transparent window of a second kind communicating with a corresponding second sensing element and having a transparent area equal to that of the window of the first kind.

21. An addressable workpiece positioner as in claim 20 wherein:
each window of the first kind comprises a group of parallel transparent elongated regions each having an axis of elongation parallel to the respective columns or rows of addressing indicia sensed thereby, having a width equal to that of each respective column or row of addressing indicia sensed thereby, and having a length equal to that of an integer multiple of the center-to-center spacing of the respective columns or rows of addressing indicia sensed thereby; and
each window of the second kind comprises a single transparent region having one or more rectangular areas of a width and a length equal to an integer multiple of the center-to-center spacing of the respective columns or rows of addressing indicia sensed thereby.

22. An addressable workpiece positioner as in claim 21 wherein the optical means includes a magnifying lens for enlarging the image projected onto the sensor means.

23. An addressable workpiece positioner as in claim 22 wherein the first and second sensing elements of each pair of sensing means are connected in bucking relationship.

24. An addressable workpiece positioner as in claim 19 wherein:
the coordinate axes comprise orthogonal first and second axes;
the array of coordinate addressing indicia comprises coordinate addressing indicia of uniform size uniformly arrayed in rows parallel to the first axes and in columns parallel to the second axis;
two of the pairs of sensing means are offset from one another along the first axis for sensing columns of coordinate addressing indicia of the image to determine the addressable coordinate position and the direction of movement of the stage means along the first axis; and
two of the pairs of sensing means are offset from one another along the second axis for sensing rows of coordinate addressing indicia of the image to determine the addressable coordinate position and the direction of movement of the stage means along the second axis.

25. An addressable workpiece positioner as in claim 24 wherein each pair of sensing means comprises:
a transparent window of a first kind communicating with a corresponding first sensing element; and
a transparent window of a second kind communicating with a corresponding second sensing element and having a transparent area equal to that of the window of the first kind.

26. An addressable workpiece positioner as in claim 25 wherein:
each window of the first kind comprises a group of parallel transparent elongated regions each having an axis of elongation parallel to the respective columns or rows of addressing indicia sensed thereby, having a width equal to that of each respective column or row of addressing indicia sensed thereby, and having a length equal to that of an integer multiple of the center-to-center spacing of the respective columns or rows of addressing indicia sensed thereby; and
each window of the second kind comprises a single transparent region having one or more rectangular areas of a width and a length equal to an integer multiple of the center-to-center spacing of the respective columns or rows of addressing indicia sensed thereby.

27. An addressable workpiece positioner as in claim 26 wherein the optical means includes a magnifying lens for enlarging the image projected onto the sensor means.

28. An addressable workpiece positioner as in claim 27 wherein the first and second sensing elements of each pair of sensing means are connected in bucking relationship.

29. An addressable workpiece positioner comprising:
stage means for holding a workpiece, the stage means being movable along a pair of coordinate axes to addressable coordinate positions in a plane containing those axes;
sensor means for determining the addressable coordinate position of the stage means;
the stage means including indicia means affixed thereto for movement therewith to effect coordinate positioning of the stage means, the indicia means including coordinate reference indicia and a two-dimensional array of coordinate addressing indicia;
optical means for projecting an image of a portion of the indicia means onto the sensor means;
the sensor means including first sensing means for sensing the coordinate reference indicia of the image, and second sensing means for sensing the coordinate addressing indicia of the image with reference to the sensed coordinate reference indicia to determine the addressable coordinate position of the stage means;
control means for comparing the addressable coordinate position of the stage means with another addressable coordinate position to derive an error signal; and
drive means for moving the stage means and the indicia means to said other addressable coordinate position in response to the error signal.

30. An addressable workpiece positioner as in claim 29 wherein:
the coordinate axes comprise orthogonal first and second axes;
the coordinate reference indicia comprise first and second border portions of border enclosing the array of X and Y coordinate addressing indicia with the first border portion being parallel to the second axis and with the second border portion being parallel to the first axis;

the coordinate addressing indicia are arrayed in rows parallel to the first axis and in columns parallel to the second axis; and the stage means and the indicia means may be sequentially moved to a first addressable coordinate position at which one of the first and second border portions of the image may be sensed by the first sensing means while coordinate addressing indicia of the image are sensed by the second sensing means and to a second addressable coordinate position at which the other of the first and second border portions of the image may be sensed by the first sensing means while the coordinate addressing indicia of the image are sensed by the second sensing means.

31. An addressable workpiece positioner as in claim 29 wherein:

the array of coordinate addressing indicia has an optical reflectance or transmission coefficient of a first value;

the coordinate reference indicia have an optical reflectance or transmission coefficient of a second value; and the first sensing means senses the coordinate reference indicia by detecting an optical reflectance or transmission coefficient intermediate the first and second values.

32. An addressable workpiece positioner as in claim 31 wherein:

the coordinate axes comprise orthogonal first and second axes;

the coordinate reference indicia comprises first and second border portions of a border enclosing the array of X and Y coordinate addressing indicia with the first border portion being parallel to the second axis and with the second border portion being parallel to the first axis;

the coordinate addressing indicia are arrayed in rows parallel to the first axis and in columns parallel to the second axis; and the stage means and the indicia means may be sequentially moved to a first addressable coordinate position at which one of the first and second border portions of the image may be sensed by the first sensing means while coordinate addressing indicia of the image are sensed by the second sensing means and to a second addressable coordinate position at which the other of the first and second border portions of the image may be sensed by the first sensing means while the coordinate addressing indicia of the image are sensed by the second sensing means.

33. An addressable workpiece positioner as in claim 31 wherein the optical means includes a magnifying lens for enlarging the image projected onto the sensor means.

34. An addressable workpiece positioner as in claim 33 wherein:

the coordinate axes comprise orthogonal first and second axes;

the coordinate reference indicia comprise first and second border portions of a border enclosing the array of X and Y coordinate addressing indicia with the first border portion being parallel to the second axis and with the second border portion being parallel to the first axis;

the coordinate addressing indicia are arrayed in rows parallel to the first axis and in columns parallel to the second axis; and the stage means and the indicia means may be sequentially moved to a first addressable coordinate position at which one of the first and second border portions of the image may be sensed by the first sensing means while coordinate addressing indicia of the image are sensed by the second sensing means and to a second addressable coordinate position at which the other of the first and second border portions of the image may be sensed by the first sensing means while the coordinate addressing indicia of the image are sensed by the second sensing means.

35. An addressable workpiece positioner comprising:

stage means, movable along a pair of coordinate axes, for holding a workpiece to be positioned;

a two-dimensioned array of coordinate addressing indicia together with coordinate reference indicia for the array of coordinate addressing indicia, affixed to the stage means, for movement with the stage means;

sensor means for sensing the coordinate addressing indicia and the coordinate reference indicia to provide output information determinative of the coordinate position of the stage means; and control means, responsive to output information from the sensor means and to input control information, for moving the stage means to coordinate positions determined by the input control information.

36. An addressable workpiece positioner as in claim 35 wherein:

said coordinate addressing indicia are uniformly arrayed in rows parallel to one of the coordinate axes and in columns parallel to the other of the coordinate axes;

one of said coordinate reference indicia is disposed parallel to said one of the coordinate axes and adjacent to one side of the array of coordinate addressing indicia, and another of said coordinate reference indicia is disposed parallel to said other of the coordinate axes and adjacent to another side of the array of coordinate addressing indicia.

37. An addressable workpiece positioner as in claim 36 wherein said coordinate reference indicia comprise portions of a border circumscribing the array of coordinate addressing indicia.

38. An addressable workpiece positioner as in claim 37 wherein said coordinate addressing indicia and said coordinate reference indicia comprise reflective regions formed on a transparent plate disposed between the sensor means and the position of the workpiece.

39. An addressable workpiece positioner as in claim 35 wherein said sensor means includes:

addressing indicia sensing means for sensing the coordinate addressing indicia to provide output information determinative of the coordinate position of the stage means; and reference indicia sensing means for sensing the coordinate reference indicia to provide output information for referencing the sensed coordinate addressing indicia.

40. An addressable workpiece positioner as in claim 39 wherein:

said array of coordinate addressing indicia has an optical reflectance or transmission coefficient of a first value;

each of said coordinate reference indicia has an optical reflectance or transmission coefficient of a second value; and said addressing indicia sensing means senses the coordinate addressing indicia by detecting an optical reflectance or transmission coefficient intermediate the first and second values.

41. An addressable workpiece positioner as in claim 39 wherein said stage means may be sequentially moved to a first coordinate position at which one of the coordinate reference indicia may be sensed by the reference indicia sensing means while coordinate addressing indicia are sensed by the addressing indicia sensing means and to a second coordinate position at which the other of the coordinate reference indicia may be sensed by the reference indicia sensing means while the coordinate addressing indicia are sensed by the addressing indicia sensing means.

42. An addressable workpiece positioner as in claim 41 wherein said reference indicia sensing means comprises a pair of transparent windows each communicating with a corresponding photodetector.

43. An addressable workpiece positioner comprising:
stage means, movable along a pair of coordinate axes, for holding a workpiece to be positioned;
a two-dimensional array of coordinate addressing indicia, affixed to the stage means, for movement with the stage means;
said coordinate addressing indicia being uniformly arrayed in rows parallel to one of the coordinate axes and in column parallel to the other of the coordinate axes;
sensor means for sensing the coordinate addressing indicia to provide output information determinative of the coordinate position of the stage means;
said sensing means including at least a first pair of sensing means disposed for sensing the coordinate addressing indicia arrayed to rows parallel to said one of the coordinate axes to provide output information determinative of one coordinate of the coordinate position of the stage means, and at least a second pair of sensing means disposed for sensing the coordinate addressing indicia arrayed in columns parallel to said other of the coordinate axes to provide output information determinative of another coordinate of the coordinate position of the stage means;
optical means for projecting an image of a portion of the array of coordinate addressing indicia onto the sensor means;
compensating means, including each pair of sensing means, for compensating for undesired variations in the intensity of the image; and
control means, responsive to the output information from the sensor means and to input control information, for moving the stage means to coordinate positions determined by the input control information.

44. An addressable workpiece positioner as in claim 43 wherein each of said pairs of sensing means comprises:
a transparent window of a first kind communicating with a corresponding first photodetector; and
a transparent window of a second kind communicating with a corresponding second photodetector and having a transparent area equal to that of the window of the first kind;
said first and second photodetectors of each pair of sensing means being connected in bucking relationship.

45. An addressable workpiece positioning method comprising the steps of:
placing the workpiece to be positioned on a stage that is movable along coordinate axes in a plane containing or parallel to those axes and that has a two-dimensional array of coordinate addressing indicia affixed thereto for movement therewith;
projecting an image of at least a portion of the array of coordinate addressing indicia onto a sensor;
sensing the coordinate addressing indicia through at least two pairs of pattern recognition windows included in the sensor with each pair disposed for independently recognizing and sensing coordinate addressing indicia aligned parallel to a different one of the coordinate axes to derive output information determinative of a different coordinate of the position of the stage and to derive a sensed output through each window of each pair;
subtracting the sensed output derived through one window of each pair of pattern recognition windows from the sensed output derived through the other window of the same pair to compensate for undesired variations in the intensity of the image;
comparing the coordinate position of the stage with a designated coordinate position to derive an error output; and
moving the stage to the designated coordinate position in response to the error output.

46. An addressable workpiece positioning method as in claim 45 wherein the array of coordinate addressing indicia is provided with border indicia for referencing the coordinate addressing indicia and the method includes the steps of:
moving the stage so that the sensor is operable for sequentially sensing the coordinate border indicia; and
referencing the sensed coordinate addressing indicia to the sensed coordinate border indicia.

47. An addressable workpiece positioning method as in claim 46 wherein:
the array of coordinate addressing indicia has an optical transmission or reflectance coefficient of a first value;
the coordinate border indicia have an optical transmission or reflectance coefficient of a second value; and
each of the coordinate addressing indicia is sensed by detecting an optical transmission or reflectance coefficient of a value intermediate the first and second values.

48. An addressable workpiece positioning method as in claim 45 wherein the last-mentioned step of moving the stage comprises moving the stage so that the sensor is operable for sequentially sensing the coordinate border indicia through respective border sensing windows included in the sensor and disposed closer to the respective coordinate border indicia than the center of each respective pair of pattern recognition windows so as to permit the pairs of pattern recognition windows to be employed for sensing the respective coordinate addressing indicia while the border sensing windows are employed for sensing the respective coordinate border indicia.

* * * * *